(12) United States Patent
Vadgama et al.

(10) Patent No.: US 12,301,177 B2
(45) Date of Patent: *May 13, 2025

(54) POWER-OVER-ETHERNET (PoE) POWERED MULTICHANNEL STREAMING AUDIO AMPLIFIER

(71) Applicant: Lenbrook Industries Limited, Pickering (CA)

(72) Inventors: Taresh Vadgama, Pickering (CA); Ross Graham Gordon Eberlin, Aurora (CA); Gregory R. Stidsen, Andover, MA (US)

(73) Assignee: Lenbrook Industries Limited, Pickering (CA)

( * ) Notice: Subject to any disclaimer, the term of this patent is extended or adjusted under 35 U.S.C. 154(b) by 0 days.

This patent is subject to a terminal disclaimer.

(21) Appl. No.: 18/763,553

(22) Filed: Jul. 3, 2024

(65) Prior Publication Data
US 2024/0364279 A1 Oct. 31, 2024

Related U.S. Application Data

(63) Continuation of application No. 17/749,551, filed on May 20, 2022, now Pat. No. 12,047,040.

(51) Int. Cl.
*H03F 3/183* (2006.01)
*H04R 5/02* (2006.01)
(Continued)

(52) U.S. Cl.
CPC .............. *H03F 3/183* (2013.01); *H04R 5/02* (2013.01); *H04R 5/04* (2013.01); *H04S 3/008* (2013.01);
(Continued)

(58) Field of Classification Search
CPC ........ H03F 3/183; H03F 2200/03; H04R 5/02; H04R 5/04; H04R 2420/09; H04S 3/008; H04S 2400/01
(Continued)

(56) References Cited

U.S. PATENT DOCUMENTS

| 11,265,358 B1 | 3/2022 | Dellalyan et al. |
| 2005/0243861 A1* | 11/2005 | Elkayam ................. H04L 12/10 713/300 |

(Continued)

FOREIGN PATENT DOCUMENTS

| CN | 2021/68186 U | 3/2012 |
| WO | WO-2023/225182 A1 | 11/2023 |

OTHER PUBLICATIONS

International Search Report and Written Opinion for International Application No. PCT/US2023/022714 dated Jun. 26, 2023.
(Continued)

*Primary Examiner* — Carolyn R Edwards
*Assistant Examiner* — Friedrich Fahnert
(74) *Attorney, Agent, or Firm* — Erik A. Huestis; Sameer K. Pai; Foley Hoag LLP

(57) ABSTRACT

A power-over-Ethernet (PoE) powered multichannel streaming audio amplifier includes a plurality of Ethernet ports each configured to be coupled to an Ethernet cable and capable of receiving power and audio data transmitted over the Ethernet cables. Power supply circuitry connected to the Ethernet ports is configured to combine and manage the power received at the Ethernet ports. A microprocessor subsystem powered by the power supply circuitry is configured to receive and process the audio data to generate output audio signals. A digital audio amplifier powered by the power supply circuitry amplifies the output audio signals received from the microprocessor system. A plurality of
(Continued)

audio outputs connected to the digital audio amplifier are each configured to be connected to a different one of a plurality of speaker devices to transmit the audio output signals amplified by the digital audio amplifier to the plurality of speaker devices.

30 Claims, 2 Drawing Sheets

(51) Int. Cl.
    *H04R 5/04*     (2006.01)
    *H04S 3/00*     (2006.01)

(52) U.S. Cl.
    CPC ...... *H03F 2200/03* (2013.01); *H04R 2420/09* (2013.01); *H04S 2400/01* (2013.01)

(58) Field of Classification Search
    USPC ........................................................ 381/300
    See application file for complete search history.

(56) References Cited

U.S. PATENT DOCUMENTS

| | | |
|---|---|---|
| 2008/0104642 A1 | 5/2008 | Galipeau et al. |
| 2008/0267212 A1 | 10/2008 | Crawley et al. |
| 2010/0187903 A1 | 7/2010 | Diab et al. |
| 2013/0049469 A1 | 2/2013 | Huff et al. |
| 2013/0097333 A1 | 4/2013 | Bathurst et al. |
| 2019/0028617 A1 | 1/2019 | Odom |
| 2020/0252225 A1 | 8/2020 | Liu |
| 2020/0303944 A1 | 9/2020 | Jonsson |
| 2020/0344079 A1 | 10/2020 | Liu |
| 2021/0143742 A1 | 5/2021 | Picard |
| 2021/0392006 A1 | 12/2021 | Rathinasamy et al. |
| 2023/0378919 A1 | 11/2023 | Vadgama et al. |

OTHER PUBLICATIONS

Mean Well RD-65B, Jul. 9, 2021.
Mean Well RD-65C, Feb. 28, 2022.

\* cited by examiner

POWER-OVER-ETHERNET (PoE) POWERED MULTICHANNEL STREAMING AUDIO AMPLIFIER

CROSS-REFERENCE TO RELATED APPLICATIONS

This application is a continuation of U.S. Non-Provisional application Ser. No. 17/749,551 filed May 20, 2022, which is hereby incorporated by reference in its entirety.

BACKGROUND

The present application relates generally to audio amplifiers and, more particularly, to a PoE powered multichannel streaming audio amplifier.

Consumers have had limited accessibility to High Resolution digital audio (audio files with greater than 48 kHz sample rate or higher than 16-bit audio bit depth). Lenbrook Industries Limited (owner of NAD Electronics and Bluesound Music Systems and the applicant of the present application) began development of a new type of High Resolution media audio playback system in 2004 and demonstrated such a system in 2009. By 2011, the NAD Masters Digital Suite Home Sound System enabled consumers to experience music via one or more networked playback devices. The system's BluOS™ operating system was expanded to more affordable devices with the introduction of the Bluesound brand in 2012. Through a software control application installed on a controller (e.g., IR remote, wall mounted controller, smartphone, tablet, computer, voice input device), consumers can play what they desire in any room having a networked playback device. They can access High Resolution music files by each room with a playback device and group rooms together for synchronous playback of the same music. The BluOS™ modular software design also allows the unification of audio video receiver (AVR) devices, reducing the cost of software development compared to highly proprietary MCU/DSP software currently used throughout the AVR industry.

Distribution and playback of High Resolution audio throughout large commercial facilities has typically relied on high-power multichannel audio amplifiers installed in a dedicated equipment rack. Larger audio system installations in commercial settings (e.g., hotels, airports, and restaurants) typically involve multiple audio equipment racks in equipment rooms distributed throughout the facility. Each audio equipment rack requires the installation of a dedicated mains-voltage electrical supply circuit, requiring the costly services of a licensed electrician and safety inspections as required by building codes in most jurisdictions. The costs become even more apparent in facilities undergoing retrofit to upgrade their sound systems, as this requires additional effort to modify a facilities structure to place additional mains-voltage circuits wherever conventional audio amplification is needed. Alternatives to the costly dedicated electrical circuits have been considered for these applications. These typically involve lower-voltage AC and DC electrical sources that reduce the number of high-voltage mains circuits required for each audio amplification device. Cost-reducing solutions include installation of wiring carrying a lower voltage to a compatible audio amplifier device. Generally, installation of wiring carrying less than 48 Volts does not require the costly services of a licensed electrician. However, these alternatives have carried two principal drawbacks. The quality of the sound is reduced as there is ultimately less power available from lower voltage power supply cabling. These lower voltage power supplies and their cabling are usually proprietary and not associated with any standard, leaving commercial system designers with only one option for procuring cable and power conversion equipment manufactured by the audio system vendor. Some previous solutions were simply low-voltage DC cabling, which did not have the ability to carry digital music services to streaming audio amplifiers. These long-standing shortcomings highlight a need for a better technical option for eliminating high licensed electrician costs and installation challenges for multichannel streaming audio amplifiers.

BRIEF SUMMARY OF THE DISCLOSURE

A power-over-Ethernet powered multichannel streaming audio amplifier in accordance with one or more embodiments includes a plurality of Ethernet ports each configured to be coupled to an Ethernet cable and capable of receiving power and audio data transmitted over the Ethernet cables. Power supply circuitry connected to the Ethernet ports is configured to combine and manage the power received at the Ethernet ports. A microprocessor subsystem powered by the power supply circuitry is configured to receive and process the audio data to generate output audio signals. A digital audio amplifier powered by the power supply circuitry amplifies the output audio signals received from the microprocessor system. A plurality of audio outputs connected to the digital audio amplifier are each configured to be connected to a different one of a plurality of speaker devices to transmit the audio output signals amplified by the digital audio amplifier to the plurality of speaker devices.

A method in accordance with one or more embodiments is disclosed for operating a multichannel streaming audio amplifier, which is connected by a plurality of Ethernet cables to power-over-Ethernet enabled power sourcing equipment. The method comprises the steps of: (a) receiving, at Ethernet ports in the multichannel streaming audio amplifier, power transmitted over each of the plurality of Ethernet cables and audio data transmitted over one of the plurality of Ethernet cables; (b) combining the power received from the plurality of Ethernet cables to power a microprocessor subsystem and a digital audio amplifier in the multichannel streaming audio amplifier; (c) processing the audio data by the microprocessor subsystem to generate output audio signals; (d) amplifying the output audio signals by the digital audio amplifier; and (e) outputting the audio output signals amplified by the digital audio amplifier to a plurality of speaker devices for rendering by the plurality of speaker devices.

BRIEF DESCRIPTION OF THE DRAWINGS

Like or identical reference numbers are used to identify common or similar elements.

DETAILED DESCRIPTION

Various embodiments disclosed herein relate to a PoE powered multichannel streaming audio amplifier.

Standardized low-voltage computer Ethernet cables can carry up to 90 Watts of power under current IEEE 802.3bt PoE standards. Although attractive for its 90 Watt capacity, this standard still does not provide sufficient power for single-unit commercial audio amplifiers, which can have as many as eight output channels. Various embodiments disclosed herein relate to a PoE powered multichannel streaming audio amplifier having dual PoE network connectors. By doubling the network cables to a single-unit audio amplifier, the amount of power available can be doubled utilizing special power electronics circuitry developed to combine the power from each PoE connector input. This increased power satisfies the first criterion for overcoming the drawbacks of the previous alternatives discussed above to power commercial audio amplifiers with high-voltage mains circuitry. The second criterion is satisfied by 802.3bt becoming a widely implemented IEEE standard. Since the standard's introduction, multiple well-known network switching equipment vendors have offered switches, routers, and PoE injectors with 802.3bt power capacity. The third criterion is satisfied as 802.3bt cables are inherently capable of carrying high-speed music service data allowing the design of devices powered by low-voltage standardized network technology having the ability to access popular music services such as Spotify and Apple Music.

Figure 1:
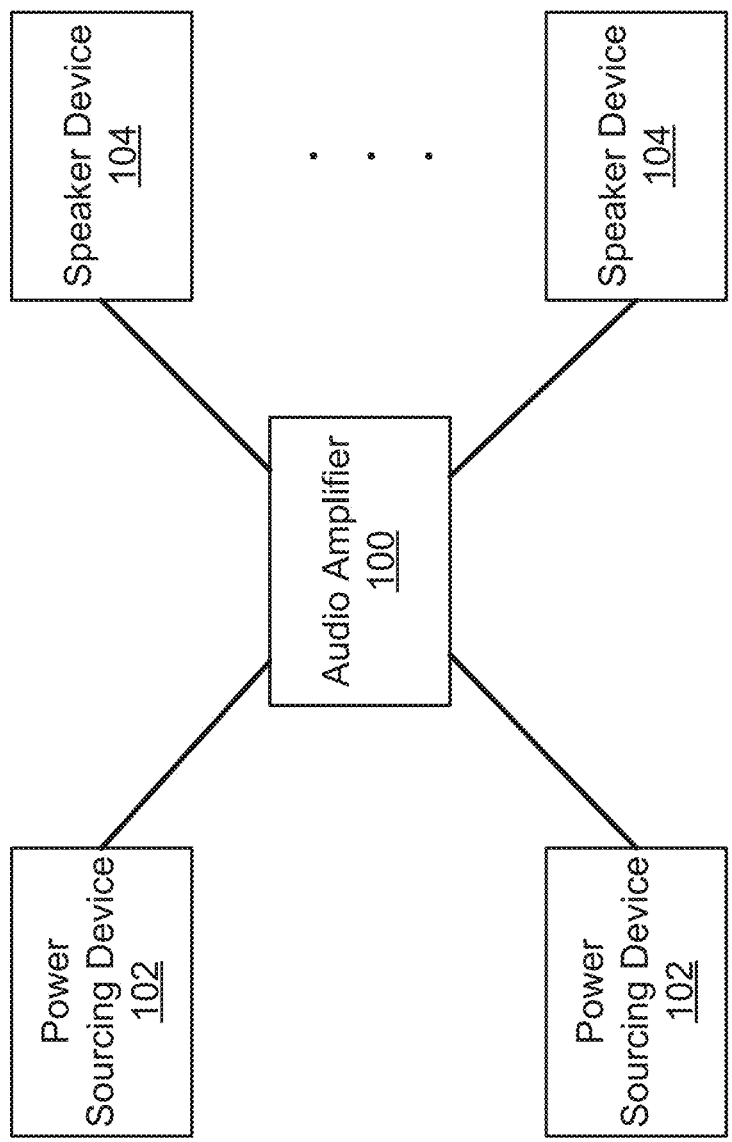
FIG. 1 is a block diagram illustrating an exemplary audio network including a PoE powered multichannel streaming audio amplifier in accordance with one or more embodiments.

FIG. 1 is a block diagram illustrating an audio network including an exemplary PoE powered multichannel streaming audio amplifier 100 in accordance with one or more embodiments. The audio amplifier 100 includes two Ethernet ports each coupled by an Ethernet cable to an 802.3bt standard Power Source Equipment (PSE) device 102. Examples of PSE devices include PoE enabled network switches and routers. Each PSE device 102 supplies power to the audio amplifier 100, and one of the PSE devices 102 additionally provides streaming audio data to the audio amplifier 100. The audio amplifier 100 processes and amplifies the audio data for rendering by a plurality of speaker devices 104 connected to the audio amplifier 100.

Figure 2:
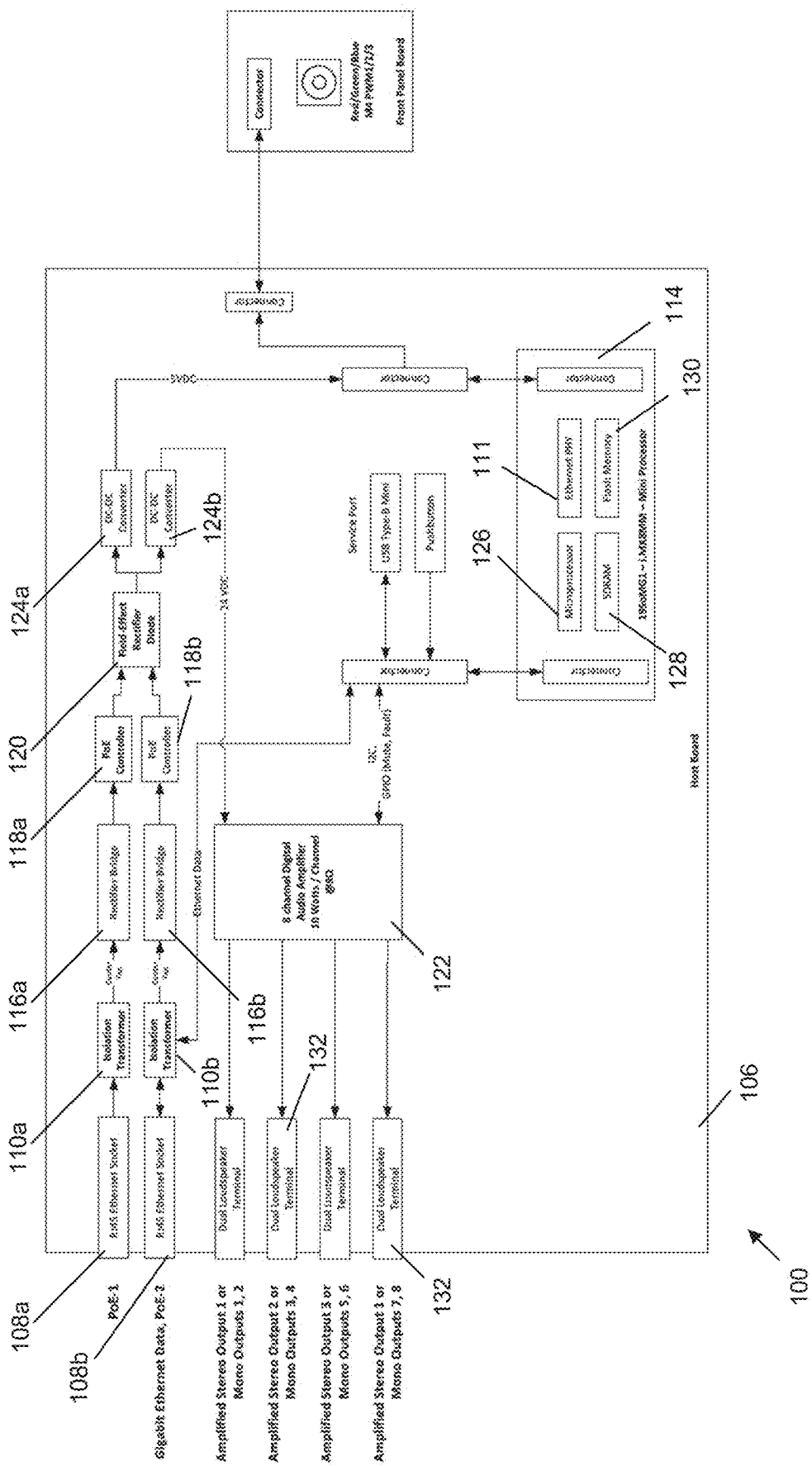
FIG. 2 is a block diagram illustrating an exemplary system architecture of the PoE powered multichannel streaming audio amplifier in accordance with one or more embodiments.

FIG. 2 is a block diagram illustrating an exemplary system architecture of the PoE powered multichannel streaming audio amplifier 100 in accordance with one or more embodiments.

In one or more embodiments, the audio amplifier 100 comprises a single electric circuit board assembly 106 containing various components for receiving and processing power and audio data from connected standardized Ethernet cables.

The audio amplifier 100 includes two independent PoE 802.3bt input circuits (Powered Device or PD controller circuits) each associated with one of the Ethernet ports. The PD controller circuits can draw power from Ethernet cables also connected to any 802.3bt standard PSE device 102. A unique, low-cost electrical subsystem using a single Field-Effect Rectifier Diode is used to combine the outputs of the PD controller circuits without adverse impacts on safety or reliability. This type of rectifier device features reduced current leakage, which minimizes its impact on the operating efficiency of the combined PD controller circuits.

The Ethernet cables can be connected to two Ethernet sockets 108a, 108b in the circuit board assembly 106.

Two isolation transformers 110a, 110b magnetically couple each Ethernet cable at the sockets 108a, 108b to the PD controller circuits. The isolation transformers 110a, 110b act as the 'front door', blocking direct current (DC) while allowing alternating currents (AC) to pass. Digital audio data signals exchanged between the device 100 and the audio network are passed from the secondary coil of the isolation transformer 110b to the Ethernet PHY 111 of a microprocessor module 114.

A special 'Center Tap' terminal of the secondary coil of each isolation transformer 110a, 110b is passed to rectifier bridges 116a, 116b, which convert the PoE AC signal to a DC form. This is then processed by the PoE controllers 118a, 118b. The PoE controllers 118a, 118b establish power recovery from the network cable after automatically identifying the 'PoE Class' or power level that is available from the particular network the device's Ethernet sockets 108a, 108b are connected to.

A Field-Effect Rectifier Diode (FERD) 120 combines the current recovered from each of the PoE Controllers 118a, 118b. This effectively doubles the current available to the two loads (the microprocessor subsystem 114 and the multichannel power amplifier 122). In one or more exemplary embodiments, the FERD 120 comprises a Schottky diode, which provides high speed switching and has a low forward voltage drop and a suitable current rating.

Two DC-DC converters 124a, 124b convert the high DC voltage recovered from the previous PoE Controller stage 118a, 118b to two lower voltages required by the digital audio amplifier 122 (24 VDC) and the microprocessor subsystem 114 (5 VDC)).

The digital audio amplifier 122 amplifies audio signals received from and processed by the microprocessor subsystem 114.

Audio output signals amplified by the digital audio amplifier 122 are transmitted the speaker devices 104 via audio outputs 132.

In one exemplary embodiment, the microprocessor subsystem 114 includes a 1 GHz ARM A53 processing core 126 and supports a minimum of 256 Megabytes of high-speed random-access memory (RAM) 128. The processing capacity of the microprocessor 126 facilitates processing of high-resolution audio data streams pulled from music services through a connected PoE enabled networking router and its Internet connection.

The microprocessor subsystem's operating power budget allows execution of an advanced operating system such as, e.g., the full BluOS™ networked operating system available from Lenbrook. BluOS™ facilitates connection to iOS™ and Android™ devices running a BluOS™ software app. This app functions as a user control device for the audio amplifier.

Power supplied to the microprocessor subsystem 114 enables effective use of flash memory 130, e.g., up to 64 Gigabytes of flash memory. The flash memory 130 allows for storage or 'caching' of the most popular music and can be particularly useful in commercial audio installations (e.g., restaurants and hotels) that must maintain continuous music playback in the event of Internet or music service outages.

In the exemplary embodiment shown in the drawings, the audio amplifier 100 includes two Ethernet ports. In alternative embodiments, the audio amplifier 100 can include more than two Ethernet ports such that power from additional Ethernet cables can be combined to further increase the available power.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be under- stood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

The invention claimed is:

1. A power-over-Ethernet (PoE) powered multichannel streaming audio amplifier, comprising:
    a plurality of Ethernet ports, each Ethernet port of the plurality of Ethernet ports configured to be coupled to an Ethernet cable, each of the plurality of Ethernet ports capable of receiving power and audio data transmitted via the Ethernet cables;
    power supply circuitry, connected to the Ethernet ports and configured to combine and manage the power received at the Ethernet ports, wherein the power supply circuitry comprises a plurality of PoE controllers, each PoE controller of the plurality of PoE controllers being coupled to one of the Ethernet cables, and each of the PoE controllers configured to:
        automatically identify an available power level corresponding to its coupled Ethernet cable, and
        recover power from its coupled Ethernet cable; and
    a microprocessor subsystem, powered by the power supply circuitry and configured to receive and process the audio data to generate output audio signals.

2. The PoE powered multichannel streaming audio amplifier of claim 1, wherein the power supply circuitry comprises a Field-Effect Rectifier Diode, connected to outputs of the plurality of PoE controllers, for combining the power received at each of the plurality of Ethernet ports.

3. The PoE powered multichannel streaming audio amplifier of claim 2, wherein the Field-Effect Rectifier Diode comprises a Schottky diode.

4. The PoE powered multichannel streaming audio amplifier of claim 2, wherein the power supply circuitry further comprises a DC-DC converter connected to the Field-Effect Rectifier Diode and to the microprocessor subsystem for converting a direct current voltage at the Field-Effect Rectifier Diode to a lower voltage for the microprocessor subsystem.

5. The PoE powered multichannel streaming audio amplifier of claim 4, wherein the lower voltage for the microprocessor subsystem is about 5 VDC.

6. The PoE powered multichannel streaming audio amplifier of claim 2, further comprising a digital audio amplifier configured to amplify the output audio signals, wherein the power supply circuitry further comprises a DC-DC converter connected to the Field-Effect Rectifier Diode and to the digital audio amplifier for converting the direct current voltage at the Field-Effect Rectifier Diode to a lower voltage for the digital audio amplifier.

7. The PoE powered multichannel streaming audio amplifier of claim 6, wherein the lower voltage for the digital audio amplifier is about 24 VDC.

8. The PoE powered multichannel streaming audio amplifier of claim 1, wherein the power supply circuitry comprises a plurality of isolation transformers, each magnetically coupled to a different one of the plurality of Ethernet ports for blocking direct current while allowing alternating current to pass through the isolation transformer.

9. The PoE powered multichannel streaming audio amplifier of claim 8, wherein the audio data received at one of the plurality of Ethernet ports is passed from a transformer coil of the isolation transformer coupled to the Ethernet port to the microprocessor subsystem.

10. The PoE powered multichannel streaming audio amplifier of claim 8, wherein the power supply circuitry further comprises a plurality of rectifier bridges, each connected to a different one of the plurality of isolation transformers for converting the alternating current passed through each isolation transformer to direct current.

11. The PoE powered multichannel streaming audio amplifier of claim 1, wherein the power and audio data are received via the Ethernet cables from power sourcing equipment.

12. The PoE powered multichannel streaming audio amplifier of claim 11, wherein the power sourcing equipment comprises a power over Ethernet enabled network router.

13. The PoE powered multichannel streaming audio amplifier of claim 1, wherein the audio data comprises a high-resolution digital audio stream from an online music service.

14. The PoE powered multichannel streaming audio amplifier of claim 1, wherein the plurality of Ethernet ports are each configured to receive power according to IEEE 802.3bt.

15. The PoE powered multichannel streaming audio amplifier of claim 1, wherein the plurality of Ethernet ports are each configured to receive 90 Watts of power.

16. The PoE powered multichannel streaming audio amplifier of claim 1, wherein the plurality of Ethernet ports comprises exactly two Ethernet ports.

17. The PoE powered multichannel streaming audio amplifier of claim 1, wherein the power supply circuitry and the microprocessor subsystem are integrated in one or more circuit boards in a housing of the audio amplifier.

18. The PoE powered multichannel streaming audio amplifier of claim 1, wherein the power supply circuitry includes a step-down switch-mode power supply circuit that converts 24 Volt DC to 5 Volts DC.

19. A method of operating a multichannel streaming audio amplifier connected by a plurality of Ethernet cables to power-over-Ethernet (PoE) enabled power sourcing equipment, the method comprising the steps of:
    receiving, at Ethernet ports in the multichannel streaming audio amplifier, power
    transmitted via each of the plurality of Ethernet cables and audio data transmitted via at least one of the plurality of Ethernet cables;
    combining the power received from the plurality of Ethernet cables to power a
    microprocessor subsystem in the multichannel streaming audio amplifier, wherein said combining further comprises, for each PoE controller of a plurality of PoE controllers coupled to one of the plurality of Ethernet cables:
        automatically identifying, an available power level corresponding to its coupled Ethernet cable, and
        recovering power from its coupled Ethernet cable; and
    processing the audio data by the microprocessor subsystem to generate output audio signals.

20. The method of claim 19 wherein said combining is performed using a Field-Effect Rectifier Diode in the multichannel streaming audio amplifier.

21. The method of claim 19, wherein said combining further comprises using isolation transformers connected to the Ethernet ports to block direct current from the Ethernet cables while allowing alternating current to pass through the isolation transformers.

22. The method of claim 21, wherein said combining further comprises using a plurality of rectifier bridges, each connected to a different one of the plurality of isolation transformers for converting the alternating current passed through each isolation transformer to direct current.

23. The method of claim 22, wherein said combining further comprises using the plurality of PoE controllers, each connected to a different one of the plurality of rectifier bridges, for processing the direct current from each rectifier bridge.

24. The method of claim 23, wherein said combining further comprises using a Field-Effect Rectifier Diode connected to the outputs of the plurality of PoE controllers for combining the direct current processed by the plurality of PoE controllers.

25. The method of claim 24, wherein said combining further comprises using a DC-DC converter connected to the Field-Effect Rectifier Diode and to the microprocessor subsystem for converting the direct current voltage at the Field-Effect Rectifier Diode to a lower voltage for the microprocessor subsystem.

26. The method of claim 25, wherein the lower voltage for the microprocessor subsystem is 5 VDC.

27. The method of claim 24, wherein said combining further comprises using a DC-DC converter connected to the Field-Effect Rectifier Diode and to a digital audio amplifier for converting the direct current voltage at the Field-Effect Rectifier Diode to a lower voltage for the digital audio amplifier.

28. The method of claim 27, wherein the lower voltage for the digital audio amplifier is 24 VDC.

29. The method of claim 19, wherein the audio data comprises a high-resolution digital audio stream from an online music service.

30. The method of claim 19, wherein the plurality of Ethernet ports are each configured to receive 90 Watts of power.

* * * * *